(12) United States Patent
Jan et al.

(10) Patent No.: US 7,071,129 B2
(45) Date of Patent: Jul. 4, 2006

(54) ENHANCING ADHESION OF SILICON NITRIDE FILMS TO CARBON-CONTAINING OXIDE FILMS

(75) Inventors: Chia-Hong Jan, Portland, OR (US); Tracey Scherban, Portland, OR (US); Ying Zhou, Portland, OR (US); Adam Schafer, Portland, OR (US); Brett Robert Schroeder, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 10/242,086

(22) Filed: Sep. 12, 2002

(65) Prior Publication Data

US 2004/0051176 A1    Mar. 18, 2004

(51) Int. Cl.
*H01L 21/26* (2006.01)
*H01L 21/324* (2006.01)
*H01L 21/31* (2006.01)
*H01L 23/48* (2006.01)

(52) U.S. Cl. ............... 438/798; 438/778; 438/788; 438/964; 257/760

(58) Field of Classification Search ............ 438/699, 438/724, 771, 787, 788, 789, 790, 791, 624, 438/778, 783, 798, 964, 710, 711; 257/758, 257/760
See application file for complete search history.

(56) References Cited

U.S. PATENT DOCUMENTS

| | | | |
|---|---|---|---|
| 5,633,208 A * | 5/1997 | Ishikawa | 438/699 |
| 6,329,297 B1 * | 12/2001 | Balish et al. | 438/714 |
| 6,407,013 B1 * | 6/2002 | Li et al. | 438/788 |
| 6,602,806 B1 * | 8/2003 | Xia et al. | 438/786 |
| 6,767,836 B1 * | 7/2004 | San et al. | 438/710 |
| 2004/0084412 A1 * | 5/2004 | Waldfried et al. | 216/67 |
| 2005/0032392 A1 * | 2/2005 | Goh et al. | 438/763 |

OTHER PUBLICATIONS

Jeff Snodgrass, Christopher Litteken, Dan Maidenberg, Jim Rim, Seung-Yeop Kook, Michael Lane, Anna Vainchtein, and Reinhold H. Dauskardt, "Adhesion and Mechanical Reliability of Low-k Interconnect Structures," Proc. 4th Annual Topical Conf. on Relibility (SRC), Stanford, CA. (2000) pp. 1-23.*

(Continued)

*Primary Examiner*—Nitin Parekh
(74) *Attorney, Agent, or Firm*—Trop, Pruner & Hu, P.C.

(57) ABSTRACT

Adhesion between silicon nitride etch-stop layers and carbon doped oxide films may be improved by using plasma argon densification treatments of the carbon doped oxide films. The resulting surface layer of the carbon doped oxide films may be carbon-depleted and may include a relatively rough interface to improve the adhesion of deposited silicon nitride films.

9 Claims, 1 Drawing Sheet

OTHER PUBLICATIONS

Kuo-Lung Fang, Bing-Yue Tsui, Chen-Chi Yang, Mao-Chieh Chen, Shyh-Dar Lee, Knut Beekmann, Tony Wilby, Kath Giles, and Sajid Ishaq, Electrical and Material Stability of ORION™ CVD Ultra Low-k Dielectric Film for Copper Interconnection, Technical Report, National Chiao-Tung University, Taiwan (2001) pp. 1-3.*

H. Donohue, K. Buchanan, R.E. Dunin-Borkowski, and S.B. Newcomb, "The Effects of Resist Strip Processing on a Porous Low k Dielectric Oxide," Proc. Microscopy of Semiconductor Materials, Mar. 31, 2003, pp. 1-4.*

S.KI. Almera, P.D. Matz, J. Kim, P.B. Smith, S. Grunow, S.S. Papa, C. Jin, and T.Q. Hurd, "Plasma Damage and Pore Sealing: Increasingly Coupled ULK Integration Challenges," Future Fab Internationalm vol. 17, Jun. 21, 2004, pp. 1-8.*

S. Wolf and R.N. Tauber, "Silicon Processing for the VLSI Era, vol. 1: Process Technology," Lattice Press, Sunset Beach, CA. (1986), p. 324.*

* cited by examiner

ENHANCING ADHESION OF SILICON NITRIDE FILMS TO CARBON-CONTAINING OXIDE FILMS

BACKGROUND

This invention relates generally to adhering silicon nitride films to carbon-containing silicon oxide films.

In interconnect systems, it is desirable to integrate low dielectric constant interlayer dielectric carbon doped oxide films. Carbon doping of the oxide improves the overall performance of the interconnect system by lowering its dielectric constant. However, the carbon doping also degrades the interface adhesion between the carbon doped oxide interlayer dielectric films and silicon nitride etch-stop films. As a result of the poor adhesion, thermomechanical failures may occur due to packaging induced stress. These failures may occur at the top and bottom of the carbon doped oxide films.

Current techniques for solving this problem involve using a downstream plasma ammonia pretreatment of the carbon doped oxide film surface before the silicon nitride film deposition. However, this treatment merely removes surface contaminants and does not reduce or solve the adhesion problem.

Thus, there is a need for better ways to adhere silicon nitride films to carbon-doped oxide films.

DETAILED DESCRIPTION

A directional plasma argon densification treatment of carbon doped oxide films prior to silicon nitride deposition improves the adhesion between the silicon nitride etch-stop film layer and a carbon doped oxide film layer. The densified surface layer creates a buried interface to the bulk carbon doped oxide film. Adhesion between the silicon nitride and the carbon doped oxide film may be improved by more than 50 percent in some embodiments.

The use of the argon densification process modifies the carbon doped oxide film chemically by producing a carbon-depleted or silicon dioxide-like surface layer. It also modifies the carbon doped oxide film physically by densifying the surface layer. In particular, it creates a rough, buried interface between the dense, carbon-depleted surface layer and the bulk carbon doped oxide film. At the same time, the actual carbon doped oxide surface is not roughened.

Figure 1:
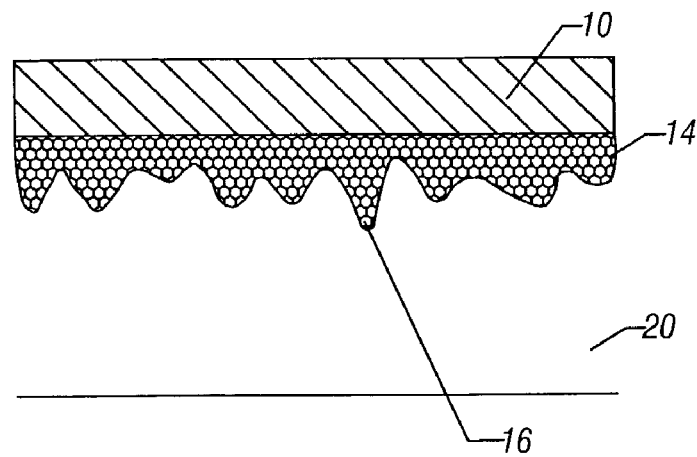
FIG. 1 is an enlarged cross-sectional view of one embodiment of the present invention.

Thus, referring to FIG. 1, the carbon doped oxide film 20 may have a roughened, carbon-depleted surface layer 14 which includes protrusions 16. The silicon nitride etch-stop layer 10 may be formed, for example by deposition, on top of the densified, carbon-depleted surface layer 14.

Figure 2:
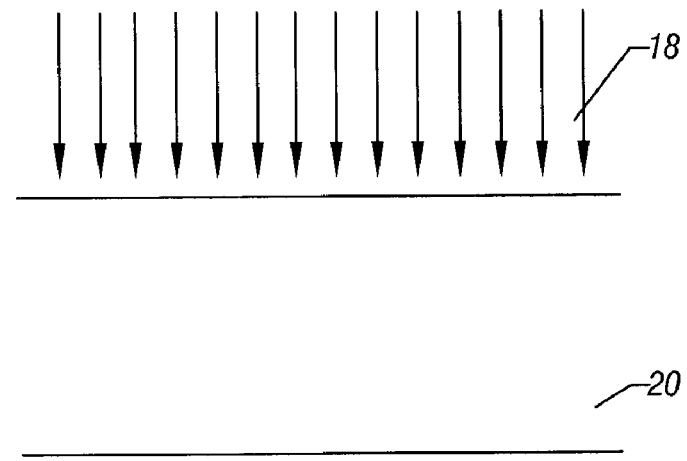
FIG. 2 is an enlarged cross-sectional view of the embodiment shown in FIG. 1 in the course of fabrication in accordance with one embodiment of the present invention.

Referring to FIG. 2, the substrate may be prepared using the conventional interconnect dual damascene processing where parts of the exposed surface are carbon doped oxide films 20. The top surfaces of the carbon doped oxide films 20 are carbon-rich and relatively porous as a bulk film and the adhesion to the silicon nitride is poor compared to undoped oxide films.

The entire surface of the carbon doped oxide film 20 may be treated with a directional argon plasma. The power and dose of the argon plasma may be high enough to create a densified, carbon-depleted layer with a buried, rough interface to the bulk films.

Figure 3:
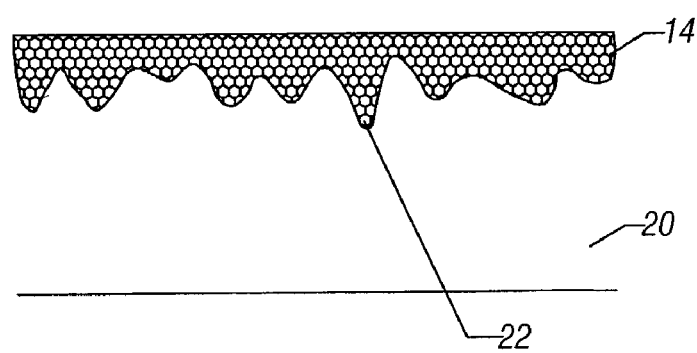
FIG. 3 is an enlarged cross-sectional view of the embodiment shown in FIG. 2 in the course of further fabrication in accordance with one embodiment of the present invention.

Thus, as shown in FIG. 3, the densified, carbon-depleted surface layer 14 may be created in the carbon doped oxide film 20 resulting in an interface with protrusions 16. Finally, the silicon nitride etch stop layer 10 is formed on the carbon-depleted surface layer 20 as an etch-stop layer for the downstream process steps. The densified, carbon-depleted layer 14 with its roughened interface can enhance the silicon nitride adhesion to the carbon doped oxide films.

For example, in some embodiments through the use of argon sputtering, the ratio of $SiCH_3$ to $SiOH$ may be lowered from 0.42 to 0.02 (measured using time-of-flight secondary ion mass spectrometry (TOFSIMS)) on the top five atomic layers), the near surface density may be increased from 1.6 g/cc to 3.9 g/cc (measured with X-ray reflectivity at 20–100 Angstroms) and the roughness of the carbon doped oxide film can be reduced from 0.19 to 0.14 nanometers, measured with atomic force microscopy (AFM). In the same example, the interface adhesion energy may be improved from 3.2 $J/m^2$ using ammonia plasma pretreatment or 4.2 $j/m^2$ using $H_2$ plasma to 5.1 $J/m^2$ with argon sputtering two times. The fracture interface root mean squared (rms) roughness in nanometers may be improved from 0.23 for ammonia pretreatment or 0.31 for $H_2$ plasma surface treatment to 0.44 with argon sputtering two times. The adhesion energy may be measured with a 4-point bending on the silicon nitride/carbon doped oxide blanket film stacks. The fracture interface roughness may be measured with an atomic force microscopy of delaminated 4-point bend samples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a carbon depleted surface layer with protrusions that extend into carbon doped oxide film.

2. The method of claim 1 comprising:
    depleting carbon in the carbon doped oxide film using an argon plasma; and
    forming a silicon nitride layer over said depleted carbon doped oxide film.

3. The method of claim 1 including forming a densified surface layer.

4. An integrated circuit comprising:
    a substrate;
    a carbon doped oxide film over said substrate, said film having a carbon depleted, densified upper surface, wherein said carbon doped oxide film has protrusions that extend downwardly into said film from said densified upper surface; and
    a silicon nitride layer adhered to said carbon doped oxide film on said surface.

5. A method comprising:
    densifying a carbon doped oxide film and forming a carbon depleted surface layer on said carbon doped oxide film;

forming a silicon nitride layer over said densified carbon doped oxide film; and forming protrusions that extend into said carbon doped oxide film from said carbon depleted surface layer.

6. The method of claim 5 including exposing said carbon doped film to an argon plasma.

7. A method comprising:

forming a carbon depleted surface layer on a carbon doped oxide film;

forming a silicon nitride layer over said surface layer of said carbon doped oxide film; and forming protrusions that extend into said carbon doped oxide film from said surface layer.

8. The method of claim 7 wherein said surface of said carbon doped oxide film is densified.

9. The method of claim 7 including exposing the surface of said carbon doped film to an argon plasma.

* * * * *